(12) United States Patent
Muraki et al.

(10) Patent No.: US 9,293,292 B2
(45) Date of Patent: Mar. 22, 2016

(54) DRAWING APPARATUS, AND METHOD OF MANUFACTURING ARTICLE

(71) Applicant: CANON KABUSHIKI KAISHA, Tokyo (JP)

(72) Inventors: Masato Muraki, Inagi (JP); Yoshihiro Hirata, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/228,415

(22) Filed: Mar. 28, 2014

(65) Prior Publication Data

US 2014/0319367 A1    Oct. 30, 2014

(30) Foreign Application Priority Data

Apr. 30, 2013 (JP) ................................ 2013-095961

(51) Int. Cl.
  *H01J 37/04* (2006.01)
  *H01J 37/317* (2006.01)
  *H01J 37/20* (2006.01)

(52) U.S. Cl.
  CPC ............ *H01J 37/045* (2013.01); *H01J 37/20* (2013.01); *H01J 37/3177* (2013.01); *H01J 2237/31761* (2013.01)

(58) Field of Classification Search
  USPC ..................... 250/397, 398, 396 R
  See application file for complete search history.

(56) References Cited

U.S. PATENT DOCUMENTS

| 2012/0273658 A1* | 11/2012 | Wieland | B82Y 40/00 250/208.2 |
| 2013/0052590 A1* | 2/2013 | Morita | B82Y 10/00 430/296 |
| 2013/0224662 A1* | 8/2013 | Suzuki | 430/296 |

FOREIGN PATENT DOCUMENTS

JP    2004-172428 A    6/2004

* cited by examiner

*Primary Examiner* — Phillip A Johnston
*Assistant Examiner* — Hsien Tsai
(74) *Attorney, Agent, or Firm* — Rossi, Kimms & McDowell LLP (57) ABSTRACT

The present invention provides a drawing apparatus for performing drawing on a substrate with a charged particle beam, the apparatus including a controller configured to perform control of the drawing performed by movement of a stage and a blanking function of each of a plurality of charged particle optical systems, wherein the controller is configured to perform, with respect to a first charged particle optical system, of the plurality of charged particle optical systems, from a plurality of charged particle beams reach a first region and a second region, formed on the substrate and adjacent to each other, the control such that the drawing is performed only in one of the first and second regions with a first portion of charged particle beams of the plurality of charged particle beams with the stage moved in a second direction.

8 Claims, 5 Drawing Sheets

DRAWING APPARATUS, AND METHOD OF MANUFACTURING ARTICLE

BACKGROUND OF THE INVENTION

1. Field of the Invention

The present invention relates to a drawing apparatus, and a method of manufacturing an article.

2. Description of the Related Art

A drawing apparatus using a charged particle beam such as an electron beam performs overlay drawing that draws a new pattern overlaid on a pattern (to be referred to as a "shot pattern" hereinafter) formed in each shot region of a substrate.

In the overlay drawing, first, a substrate is moved based on the designed array coordinate values of a plurality of shot patterns, and positions when some of the plurality of shot patterns are aligned to a reference position are actually measured. Next, assuming the designed array coordinate values of shot patterns and actual array coordinate values to align have a unique relation including a predetermined error, error parameters are decided such that the average deviation between the plurality of measured values and the actual array coordinate values to align is minimized. The actual array coordinate values of the shot patterns are obtained based on the error parameters and the designed array coordinate values of the shot patterns. The substrate is positioned in accordance with the actual array coordinate values, and a pattern is drawn.

In such overlay drawing, distortions (for example, expansion/contraction and rotation) of shot patterns are also measured as well as the actual array coordinate values of the shot patterns. The distortions of shot patterns occur due to factors of a lithography apparatus such as a drawing apparatus when forming a pattern or due to deformation of a substrate caused by a heat process when forming a pattern.

Figure 5A:
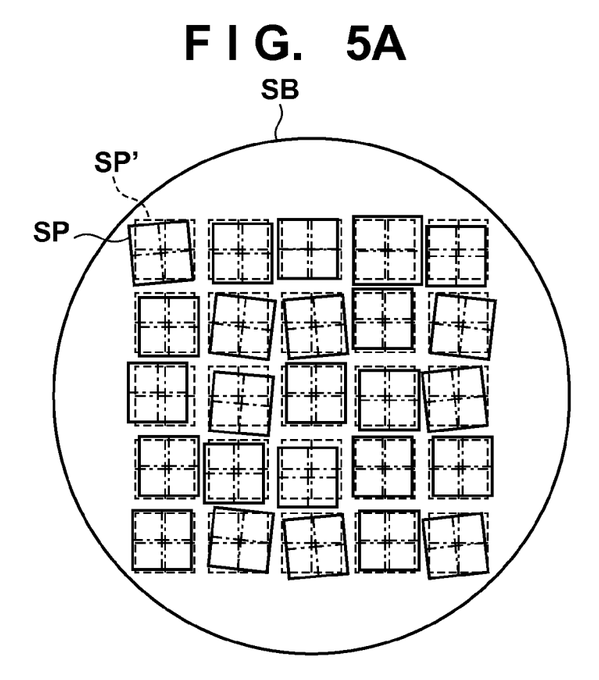
FIGS. 5A and 5B are views for explaining stripe drawing in overlay drawing.
Figure 5B:
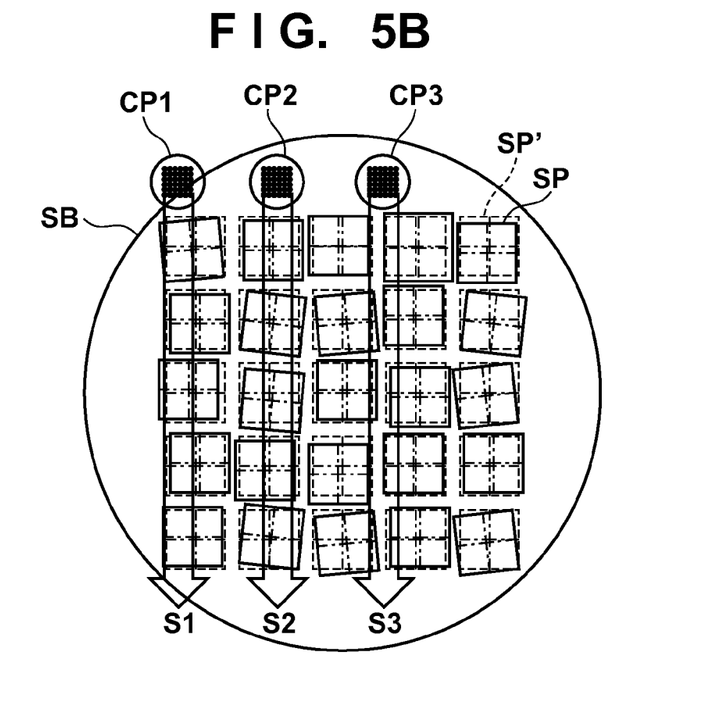

FIG. 5A is a view showing the array of 5 (rows)×5 (columns) shot patterns formed on a substrate SB. Actual shot patterns SP are indicated by solid lines, and designed shot patterns SP' are indicated by broken lines. FIG. 5B shows a state in which overlay drawing is performed for the substrate SB (actual shot patterns SP) by a drawing apparatus including a plurality of charged particle optical systems CP1, CP2, and CP3. Referring to FIG. 5B, each of the charged particle optical systems CP1 to CP3 emits 5 (rows)×5 (columns) charged particle beams to the substrate SB. When a stage that holds the substrate SB is moved to the upper side with respect to the charged particle optical systems CP1, CP2, and CP3, the charged particle optical systems CP1, CP2, and CP3 draw stripe regions S1, S2, and S3, respectively (stripe drawing). In this stripe drawing, multiple irradiation is performed for the same positions of the substrate by the charged particle beams of the charged particle optical systems which are arrayed in the substrate moving direction. The irradiation is on/off-controlled, thereby controlling the irradiating doses of the charged particle beams on the substrate.

Each charged particle optical system includes a deflector configured to deflect charged particle beams. This deflector adjusts the positions of (drawing regions defined by) a plurality of charged particle beams on the substrate at once. In the stripe drawing, a new pattern is overlaid and drawn on the shot patterns while adjusting the positions of the drawing regions of the charged particle optical systems by the deflectors based on the actual positions of the shot patterns on the substrate.

However, depending on the size of the shot patterns, the drawing region of a charged particle optical system may extend over shot patterns adjacent in a direction perpendicular to the substrate moving direction (that is, located on both of two adjacent shot patterns), like the charged particle optical system CP3 shown in FIG. 5B. This poses the following problem. In fact, the shot patterns on the substrate are not always periodically arrayed along the designed array coordinates (that is, the positions of the shot patterns are shifted). It is therefore necessary to perform drawing while adjusting (correcting) the position of the drawing region with respect to the shot patterns. However, when the drawing region of a charged particle optical system extends over shot patterns adjacent in the direction perpendicular to the substrate moving direction, the position of the drawing region of the charged particle optical system can be corrected with respect to only one of the shot patterns.

To solve this problem, Japanese Patent Laid-Open No. 2004-172428 proposes a drawing apparatus capable of mechanically adjusting the distances between the optical axes of a plurality of charged particle optical systems.

In this conventional technique, however, the precision of mechanically adjusting the distances between the optical axes of the plurality of charged particle optical systems is not sufficient and cannot meet the overlay precision required in recent overlay drawing.

SUMMARY OF THE INVENTION

The present invention provides, for example, a drawing apparatus advantageous in terms of overlay precision in performing drawing on a substrate using a plurality of charged particle optical systems.

According to one aspect of the present invention, there is provided a drawing apparatus for performing drawing on a substrate with a charged particle beam, the apparatus including a plurality of charged particle optical systems each having a blanking function of individually blanking a plurality of charged particle beams arrayed in a first direction, the plurality of charged particle optical systems being arranged at an interval in the first direction, a stage configured to hold the substrate and be movable, and a controller configured to perform control of the drawing performed by movement of the stage and the blanking function of each of the plurality of charged particle optical systems, wherein the controller is configured to perform, with respect to a first charged particle optical system, of the plurality of charged particle optical systems, from which the plurality of charged particle beams reach a first region and a second region, formed on the substrate and adjacent to each other in the first direction, the control such that the drawing is performed only in one of the first and second regions with a first portion of charged particle beams of the plurality of charged particle beams with the stage moved in a second direction.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

Figure 1:
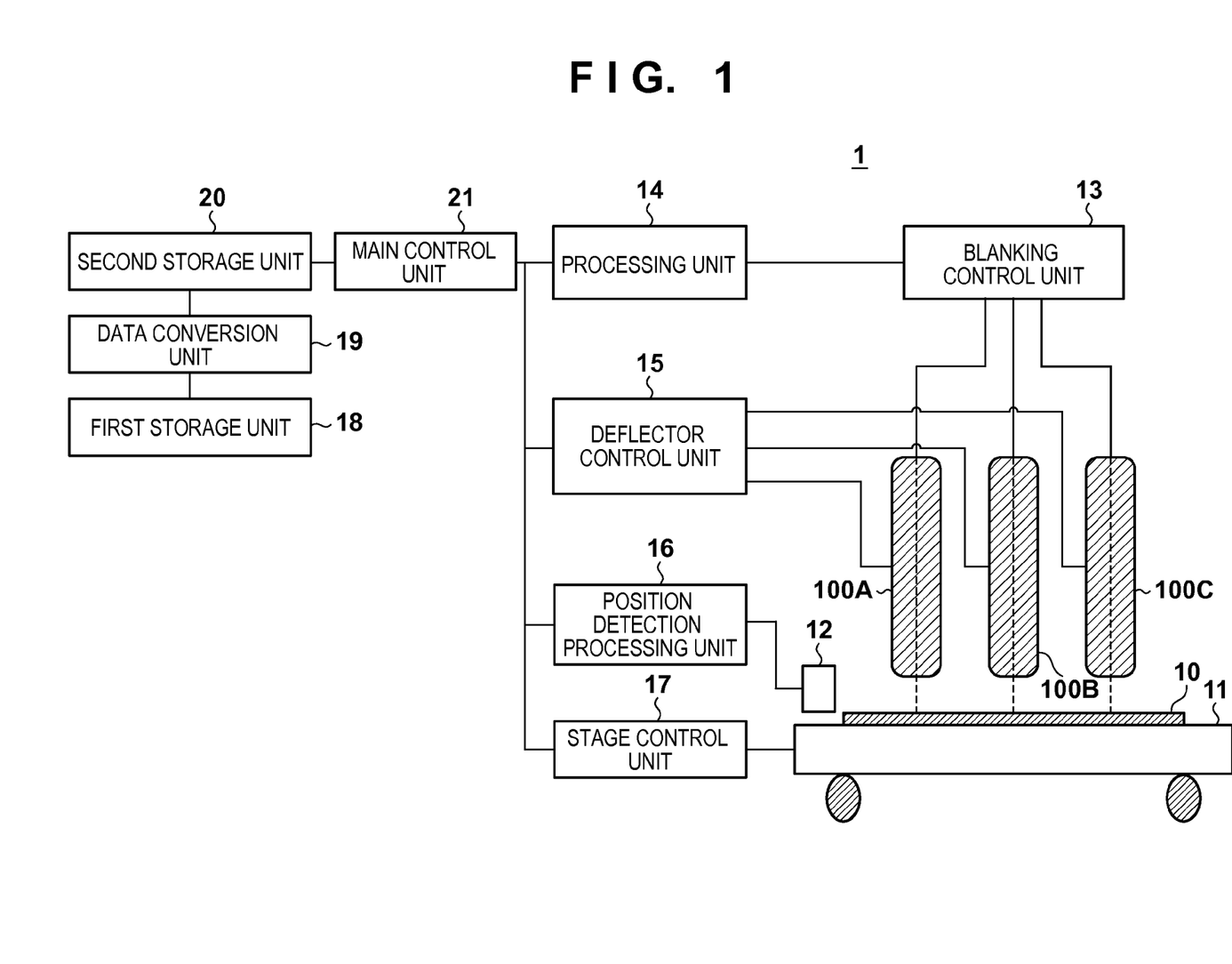
FIG. 1 is a schematic view showing the arrangement of a drawing apparatus according to an embodiment of the present invention.

FIG. 1 is a schematic view showing the arrangement of a drawing apparatus 1 according to an embodiment of the present invention. The drawing apparatus 1 is a lithography apparatus for performing drawing on a substrate by a charged particle beam. In this embodiment, a pattern is drawn on a substrate using a plurality of charged particle beams emitted by each of a plurality of charged particle optical systems. The charged particle beam is not limited to an electron beam and may be, for example, an ion beam.

The drawing apparatus 1 includes a plurality of charged particle optical systems (in this embodiment, three charged particle optical systems, that is, a first charged particle optical system 100A, a second charged particle optical system 100B, and a third charged particle optical system 100C), a substrate stage 11, and a position detection system 12. The drawing apparatus 1 also includes a blanking control unit 13, a processing unit 14, a deflector control unit 15, a position detection processing unit 16, a stage control unit 17, a first storage unit 18, a data conversion unit 19, a second storage unit 20, and a main control unit 21.

Each of the first charged particle optical system 100A, the second charged particle optical system 100B, and the third charged particle optical system 100C emits a plurality of charged particle beams. Each of the first charged particle optical system 100A, the second charged particle optical system 100B, and the third charged particle optical system 100C has a blanking function of individually blanking the plurality of charged particle beams.

Figure 2:
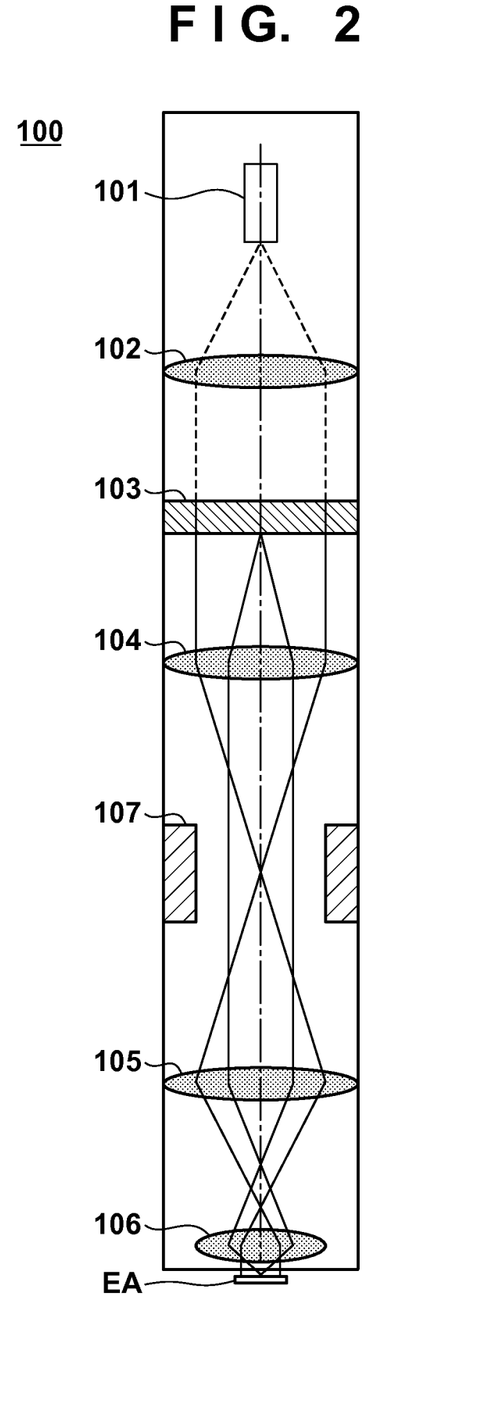
FIG. 2 is a schematic view showing the arrangement of a charged particle optical system of the drawing apparatus shown in FIG. 1.

FIG. 2 is a schematic view showing the arrangement of a charged particle optical system 100 applicable as the first charged particle optical system 100A, the second charged particle optical system 100B, and the third charged particle optical system 100C. The charged particle optical system 100 includes a charged particle source 101, a collimator lens 102, a blanking aperture array 103, an electrostatic lens 104, a magnetic field lens 105, an objective lens 106, and a deflector 107.

The charged particle source 101 is a thermionic charged particle source including, for example, $LaB_6$ or BaO/W (dispenser cathode) as a charged particle beam emitting material. The collimator lens 102 is an electrostatic lens configured to converge a charged particle beam by an electric field. A charged particle beam emitted by the charged particle source 101 changes to an almost parallel charged particle beam via the collimator lens 102.

The blanking aperture array 103 divides the almost parallel charged particle beam from the collimator lens 102 into a plurality of charged particle beams by two-dimensionally arrayed apertures (not shown). The blanking aperture array 103 includes an electrostatic blanking deflector (not shown) capable of individually driving the plurality of charged particle beams, and switches irradiation and non-irradiation of each of the plurality of charged particle beams on the substrate. Note that blanking (non-irradiation) of a charged particle beam can be performed by an arrangement including a deflector, as described above, but may be done by another known arrangement.

The electrostatic lens 104 and the magnetic field lens 105 cooperatively form an intermediate image of the plurality of apertures of the blanking aperture array 103. The objective lens 106 is a magnetic field lens and projects the intermediate image of the plurality of apertures onto a substrate. The deflector 107 deflects the plurality of charged particle beams from the blanking aperture array 103 in a predetermined direction at once, and changes the position of a drawing region EA defined by the plurality of charged particle beams.

Referring back to FIG. 1, the substrate stage 11 holds a substrate 10 and moves. The substrate stage 11 includes, for example, an X-Y stage movable within an X-Y plane (horizontal plane) perpendicular to the optical axis of the charged particle optical system 100, and an electrostatic chuck configured to hold (attract) the substrate 10. In addition, a detector including an opening pattern where the charged particle beams enter and configured to detect the positions of the charged particle beams is arranged on the substrate stage 11.

The position detection system (detection unit) 12 includes an irradiation system configured to irradiate marks (for example, alignment marks) formed on the substrate 10 with light having a wavelength to which a resist (photoresist) is not sensitive, and an image sensor configured to capture an image of light specularly reflected by the marks, and detects the positions of the marks.

The blanking control unit 13 individually controls the blanking aperture arrays 103 of the first charged particle optical system 100A, the second charged particle optical system 100B, and the third charged particle optical system 100C. The processing unit 14 includes a buffer memory and a data processing circuit, and generates control data of the first charged particle optical system 100A, the second charged particle optical system 100B, and the third charged particle optical system 100C.

The deflector control unit 15 individually controls the deflectors 107 of the first charged particle optical system 100A, the second charged particle optical system 100B, and the third charged particle optical system 100C. The position detection processing unit 16 specifies (calculates) the actual coordinate values (positions) of shot patterns and distortions of the shot patterns based on the output (detection result) from the position detection system 12. The stage control unit 17 controls positioning of the substrate stage 11 in cooperation with laser interferometers (not shown) configured to measure the position of the substrate stage 11.

The first storage unit 18 is a memory configured to store design graphic data corresponding to a pattern to be drawn on the substrate 10. The data conversion unit 19 divides the design graphic data stored in the first storage unit 18 into stripes having a width set in the drawing apparatus 1, thereby converting the data into intermediate graphic data to facilitate drawing processing. The second storage unit 20 is a memory configured to store the intermediate graphic data.

The main control unit 21 includes a CPU and a memory and controls the whole (respective units) of the drawing apparatus 1. The main control unit 21 transfers the intermediate graphic data to (the buffer memory of) the processing unit 14 in accordance with the pattern to be drawn on the substrate 10, and generally controls the drawing apparatus 1 via the above-described respective units of the drawing apparatus 1. In this embodiment, the blanking control unit 13, the processing unit 14, the deflector control unit 15, the position detection processing unit 16, the stage control unit 17, the first storage unit 18, the data conversion unit 19, and the second storage unit 20 are individually constituted. However, the main control unit 21 may have those functions.

Figures 3A, 3B:
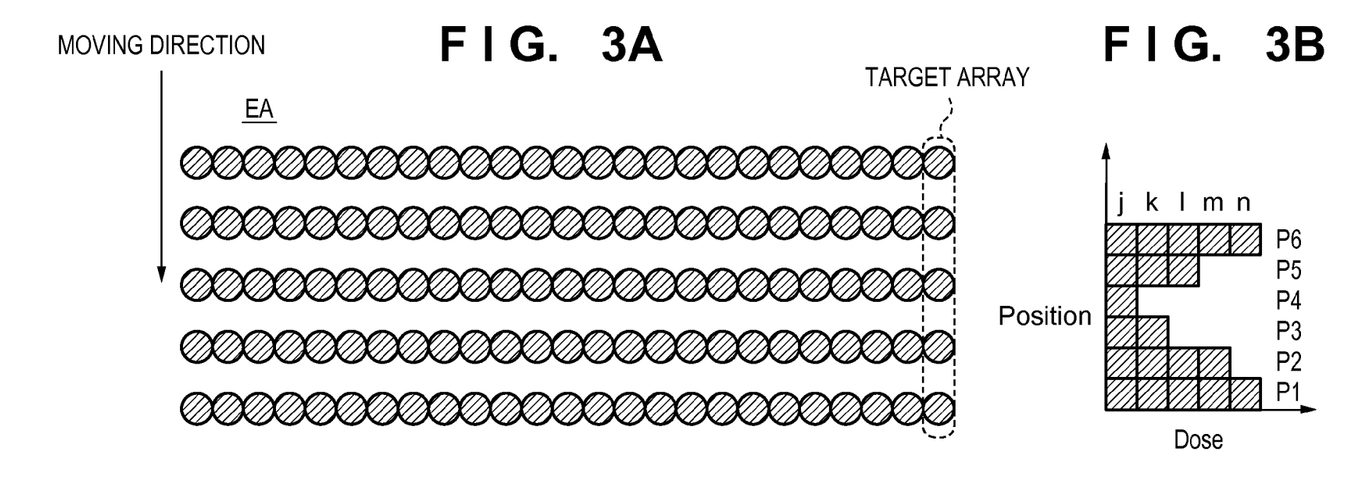
FIGS. 3A to 3C are views for explaining drawing processing of the drawing apparatus shown in FIG. 1.
Figure 3C:
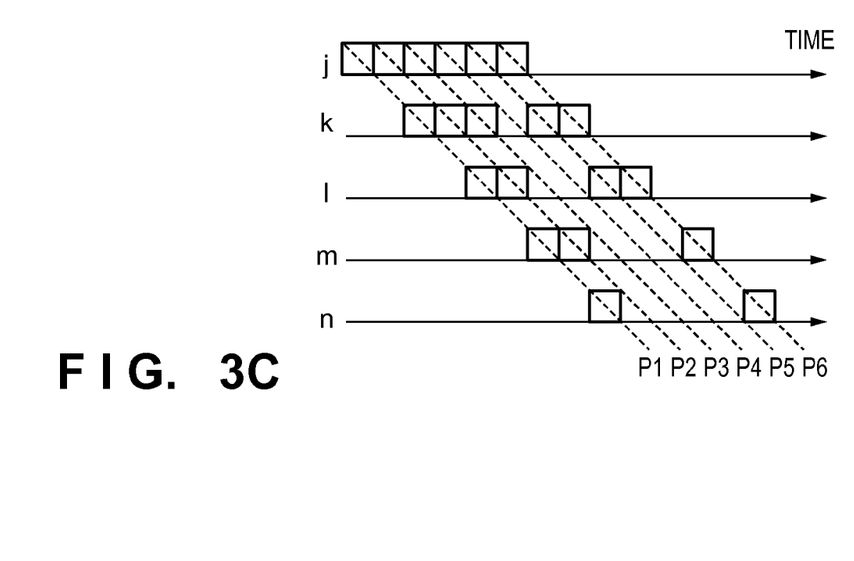

FIGS. 3A to 3C are views for explaining drawing processing of the drawing apparatus 1. FIG. 3A is a view showing an example of the array of a plurality of charged particle beams which are emitted by the charged particle optical system 100 and define the drawing region EA on the substrate. In this embodiment, the plurality of charged particle beams include 5 (rows)×20 (columns) charged particle beams. The row pitch is twice larger than the column pitch. In other words, the charged particle optical system 100 emits a plurality of charged particle beams arrayed in a first direction (row direction) and a direction (column direction) perpendicular to the first direction. The moving direction of the substrate stage 11 is a direction from the upper side to the lower side of the drawing surface (a second direction crossing the first direction, more specifically, a direction perpendicular to the first direction), as indicated by the arrow in FIG. 3A.

In this case, the main control unit 21 controls whether to irradiate the same position on the substrate with each of the plurality of charged particle beams that are arrayed in the column direction while continuously moving the substrate stage 11, thereby performing the drawing. In other words, the main control unit 21 performs control of the drawing by movement of the substrate stage 11 and the blanking function of the charged particle optical system 100. Assume a case in which drawing is performed on the substrate using the target charged particle beam array shown in FIG. 3A such that a relation shown in FIG. 3B holds between positions P1 to P6 on the substrate and the irradiating doses (exposure doses) of the charged particle beams at the positions P1 to P6 on the substrate. Assume that all charged particle beams irradiate the substrate by the same clock, the rows of the target charged particle beam array are represented by j, k, l, m, and n, and the substrate stage 11 is continuously moved in the column direction at such a speed that moves the substrate stage by the row pitch on a unit clock basis.

In this case, when on/off of each of the charged particle beams of the respective rows j to n of the target charged particle beam array (that is, whether to irradiate the substrate with the charged particle beams) is set (controlled) on a unit clock basis as shown in FIG. 3C, a relation as shown in FIG. 3B is obtained. Referring to FIG. 3C, dotted lines correspond to signals representing on (square) and off (no symbol) of the charged particle beams of the rows j to n, which irradiate the positions P1 to P6 on the substrate. This is because the substrate stage 11 moves by the pitch of the rows j to n of the target charged particle beam array in correspondence with two unit clocks. The relation shown in FIG. 3B is obtained by adding the irradiating doses of the charged particle beams of the rows j, k, l, m, and n shifted by two unit clocks. Since the charged particle beams arrayed in the column direction control the tones of irradiating doses, the relation is obtained only after all the charged particle beams arrayed in the column direction end the drawing.

A case will be explained with reference to FIGS. 4A to 4C, in which drawing is performed on a plurality of shot regions SH of a substrate using the first charged particle optical system 100A, the second charged particle optical system 100B, and the third charged particle optical system 100C of the drawing apparatus 1. Each of the first charged particle optical system 100A, the second charged particle optical system 100B, and the third charged particle optical system 100C emits a plurality of charged particle beams arrayed in the first direction (row direction) and the direction (column direction) perpendicular to the first direction. The first charged particle optical system 100A, the second charged particle optical system 100B, and the third charged particle optical system 100C are arranged in the first direction while being spaced apart from each other at an interval. The plurality of shot regions SH are arranged along the first direction in multiple stages. The substrate stage 11 is assumed to continuously move to the lower side of the drawing surface, that is, in the direction perpendicular to the first direction, as shown in FIG. 4A.

Figure 4A:
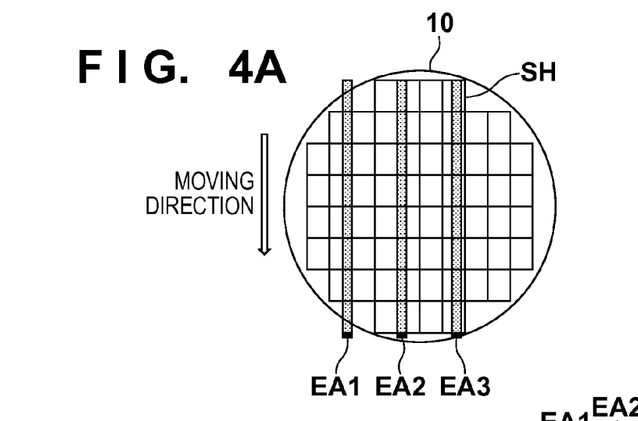
FIGS. 4A to 4C are views for explaining drawing processing of the drawing apparatus shown in FIG. 1.

Referring to FIG. 4A, EA indicates a drawing region defined by charged particle beams emitted by the first charged particle optical system 100A, and EA2 indicates a drawing region defined by charged particle beams emitted by the second charged particle optical system 100B. Similarly, EA3 indicates a drawing region defined by charged particle beams emitted by the third charged particle optical system 100C. When the substrate stage 11 that holds the substrate 10 moves, the first charged particle optical system 100A, the second charged particle optical system 100B, and the third charged particle optical system 100C draw stripe regions by the corresponding drawing regions EA1, EA2, and EA3.

In FIG. 4A, none of the drawing regions EA1, EA2, and EA3 extends over two shot regions adjacent in a direction perpendicular to the moving direction of the substrate stage 11. Hence, overlay drawing is performed on (shot patterns formed in) the shot regions SH in the entire drawing regions EA1, EA2, and EA3. In other words, for a charged particle optical system that emits a plurality of charged particle beams reaching only one shot region, drawing is performed on one shot region by irradiating the one shot region with the plurality of charged particle beams. At the boundary between shot regions along the moving direction of the substrate stage 11, each of the drawing regions EA1, EA2, and EA3 is positioned by deflecting the charged particle beams in the first direction by the deflector 107 based on the actual positions of the shot regions (shot patterns). Note that the actual position of each shot region (information of the target drawing position concerning each shot region) can be specified based on a result (output) obtained by detecting the alignment marks formed on each shot region by the position detection system 12. When stripe regions are drawn by the drawing regions EA1, EA2, and EA3, the substrate stage 11 is moved stepwise in the first direction, as shown in FIG. 4B, and next drawing is performed.

Figure 4B:
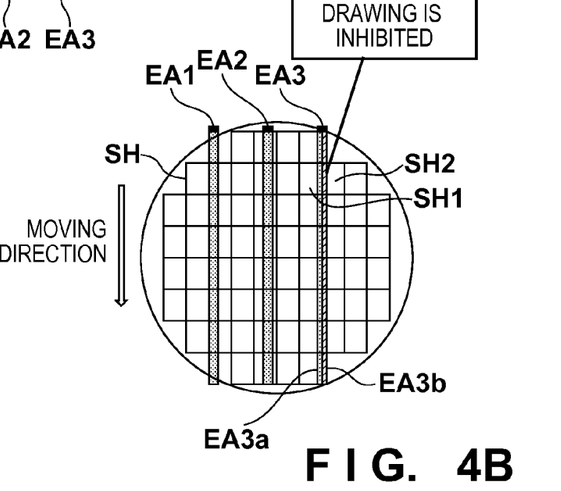

In FIG. 4B, the drawing regions EA1 and EA2 do not extend over two shot regions adjacent in a direction perpendicular to the moving direction of the substrate stage 11. Hence, for the first charged particle optical system 100A and the second charged particle optical system 100B, overlay drawing can be performed on the shot regions SH in the entire drawing regions EA1 and EA2, as described above. On the other hand, the drawing region EA3 extends over two shot regions, more specifically, a first shot region SH1 and a second shot region SH2 adjacent in the direction perpendicular to the moving direction (second direction) of the substrate stage 11. In this case, overlay drawing is performed on the first shot region SH1 not in the entire drawing region EA3 but in part of it, for example, in a first drawing region EA3*a*, and no drawing is performed in a second drawing region EA3*b* (that is, drawing in the second drawing region EA3*b* is inhibited). In other words, for a charged particle optical system that emits a plurality of charged particle beams reaching the first shot region SH1 and the second shot region SH2, drawing is performed on only one of the first shot region SH1 and the second shot region SH2. More specifically, while moving the substrate stage 11 in the second direction, irradiation of some of the plurality of charged particle beams, that is, charged particle beams that irradiate the first shot region SH1 when the substrate stage 11 moves in the second direction is controlled. At this time, the charged particle beams may be deflected in the first direction by the deflector 107 based on the actual position (information of the target drawing position) of the first shot region (shot pattern) SH1. Note that the actual position of the first shot region SH1 can be specified based on a result (output) obtained by detecting the alignment marks formed on the first shot region SH1 by the position detection system 12, as described above. When stripe regions are drawn by the drawing regions EA1 and EA2 and the first drawing region EA3a, next drawing is performed without moving the substrate stage 11 stepwise in the first direction, as shown in FIG. 4C.

Figure 4C:
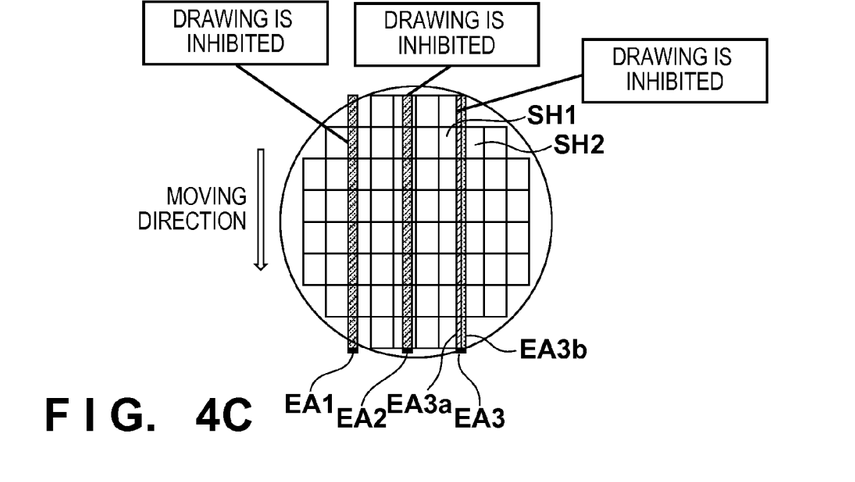

In FIG. 4C, since drawing by the drawing regions EA1 and EA2 has ended (FIG. 4B), no drawing is performed in the drawing regions EA1 and EA2 (that is, drawing in the drawing regions EA1 and EA2 is inhibited). On the other hand, for the drawing region EA3, overlay drawing is performed on the second shot region SH2 in part of the drawing region EA3, that is, in the second drawing region EA3b, and no drawing is performed in the first drawing region EA3a (that is, drawing in the first drawing region EA3a is inhibited). In other words, drawing is performed on only the other of the first shot region SH1 and the second shot region SH2. More specifically, while moving the substrate stage 11 in a third direction opposite to the second direction, irradiation of charged particle beams other than the above-described some charged particle beams, that is, charged particle beams that irradiate the second shot region SH2 when the substrate stage 11 moves in the third direction is controlled. At this time, the charged particle beams may be deflected in the first direction by the deflector 107 based on the actual position (information of the target drawing position) of the second shot region (shot pattern) SH2. Note that the actual position of the second shot region SH2 can be specified based on a result (output) obtained by detecting the alignment marks formed on the second shot region SH2 by the position detection system 12, as described above.

As described above, the drawing apparatus 1 can perform drawing on each shot region at a high overlay precision even when a drawing region defined on a substrate extends over two shot regions adjacent in the direction perpendicular to the moving direction of the substrate stage. This is because the drawing apparatus 1 can maintain a high relative positioning precision between each shot region and charged particle beams by individually performing drawing on the two adjacent shot regions without mechanically adjusting the distances between the optical axes of the charged particle optical systems. Note that a charged particle optical system whose drawing region defined on a substrate extends over two shot regions adjacent in the direction perpendicular to the moving direction of the substrate stage can be specified based on information about the array of shot region formed on the substrate and the position of the substrate stage.

In this embodiment, for the first charged particle optical system 100A and the second charged particle optical system 100B each of which emits a plurality of charged particle beams reaching only one shot region, drawing is performed on the one shot region during drawing on the first shot region SH1. However, the present invention is not limited to this. For the first charged particle optical system 100A and the second charged particle optical system 100B, drawing may be performed on the one shot region during drawing on the second shot region SH2.

In this embodiment, a description has been made using drawing on one shot region on a substrate as a unit. However, the unit of drawing of the drawing apparatus 1 is not limited to a shot region. For example, a chip region on a substrate may be used as a drawing unit.

The drawing apparatus 1 is advantageous in performing overlay drawing on a substrate using a plurality of charged particle optical systems, and is therefore suitable for manufacturing an article, for example, a micro device such as a semiconductor device or an element having a fine structure. The method of manufacturing an article includes a step of forming a latent image pattern on a substrate with a photoresist applied on it using the drawing apparatus 1 (a step of performing drawing on a substrate), and a step of developing the substrate on which the latent image pattern is formed in the above step (a step of developing the substrate on which the drawing has been performed). The manufacturing method can also include other known processes (for example, oxidation, deposition, vapor deposition, doping, planarization, etching, resist removal, dicing, bonding, and packaging). The method of manufacturing an article according to this embodiment is advantageous in at least one of the performance, quality, productivity, and production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-095961 filed on Apr. 30, 2013, which is hereby incorporated by reference herein in its entirety.

What is claimed is:

1. A drawing apparatus for performing drawing on a substrate, on which a plurality of shot regions have been formed, with a charged particle beam, the drawing apparatus comprising:

a plurality of charged particle optical systems each having a blanking function of individually blanking a plurality of charged particle beams arrayed in a first direction, the plurality of charged particle optical systems being arranged at an interval in the first direction;

a stage configured to hold the substrate and be movable; and a controller configured to perform:

control of the drawing performed by movement of the stage and the blanking function of each of the plurality of charged particle optical systems so that each of the plurality of charged particle optical systems performs the drawing in stripe regions corresponding thereto stripe by stripe, each of the stripe regions being disposed along a second direction that is different from the first direction;

with respect to a first charged particle optical system, among the plurality of charged particle optical systems, of which one of the stripe regions is on a first shot region and a second shot region, among the plurality of the shot regions, adjacent to each other in the first direction, the control so that the drawing is performed by the first charged particle optical system in either the first or second shot region in the one of the stripe regions with a first portion of the plurality of charged particle beams while the stage is being moved in the second direction; and with respect to the first charged particle optical system, after the drawing in either the first or second shot region in the one of the stripe regions, without changing the one of the stripe regions to another of the stripe regions, the control so that the drawing is performed by the first charged particle optical system in the other of the first or second shot region in the one of the stripe regions with a second portion of the plurality of charged particle beams different from the first portion while the stage is being moved in a direction opposite to the second direction.

2. The apparatus according to claim 1, wherein the first portion is charged particle beams other than charged particle beams reaching only the other of the first or second shot region, and the second portion is charged particle beams other than charged particle beams reaching only either of the first or second shot region.

3. The apparatus according to claim 1, wherein the controller is configured to perform, with respect to a second charged particle optical system, among the plurality of charged particle optical systems, of which one of the stripe regions is in one of the plurality of shot regions, the control so that the drawing is performed by the second charged particle optical system in the one of the stripe regions in the one of the plurality of shot regions with the plurality of charged particle beams thereof during the drawing by the first charged particle optical system in either the first or second shot region.

4. The apparatus according to claim 1, wherein the controller is configured to specify the first charged particle optical system based on information relating to arrangement of a plurality of shot regions formed on the substrate and a position of the stage.

5. The apparatus according to claim 1, wherein:
each of the plurality of charged particle optical systems includes a deflector configured to deflect the plurality of charged particle beams to change positions thereof on the substrate, and
the controller is configured to perform the control so that the first portion is deflected by the deflector based on information of a target drawing position relating to either the first or second shot region during the drawing by the first charged particle optical system in either the first or second shot region, and the second portion is deflected by the deflector based on information of a target drawing position relating to the other of the first or second shot region during the drawing by the first charged particle optical system in the other of the first or second shot region.

6. The apparatus according to claim 5, further comprising:
a detector configured to detect a mark formed on the substrate,
wherein the controller is configured to obtain the information of the target drawing position based on an output of the detector with respect to either the first or second shot region corresponding thereto.

7. The apparatus according to claim 1, wherein the first direction and the second direction are orthogonal to each other.

8. A method of manufacturing an article, the method comprising the steps of:
performing drawing on a substrate using a drawing apparatus; and
developing the substrate on which the drawing has been performed,
processing the developed substrate to manufacture the article,
wherein the drawing apparatus performs drawing on the substrate, on which a plurality of shot regions have been formed, with a charged particle beam, and includes:
a plurality of charged particle optical systems each having a blanking function of individually blanking a plurality of charged particle beams arrayed in a first direction, the plurality of charged particle optical systems being arranged at an interval in the first direction;
a stage configured to hold the substrate and be movable; and
a controller configured to perform:
control of the drawing performed by movement of the stage and the blanking function of each of the plurality of charged particle optical systems, so that each of the plurality of charged particle optical systems performs the drawing in stripe regions corresponding thereto stripe by stripe, each of the stripe regions being disposed along a second direction that is different from the first direction;
with respect to a first charged particle optical system, among the plurality of charged particle optical systems, of which one of the stripe regions is on a first shot region and a second shot region, among the plurality of shot regions, adjacent to each other in the first direction, the control so that the drawing is performed by the first charged particle optical system in either the first or second shot region in the one of the stripe regions with a first portion of the plurality of charged particle beams while the stage is being moved in the second direction; and
with respect to the first charged particle optical system, after the drawing in either the first or second shot region in the one of the stripe regions, without changing the one of the stripe regions to another of the stripe regions, the control so that the drawing is performed by the first charged particle optical system in the other of the first or second shot region in the one of the stripe regions with a second portion of the plurality of charged particle beams different from the first portion while the stage is being moved in a direction opposite to the second direction.

* * * * *